(12) United States Patent  
Keeth et al.

(10) Patent No.: US 9,230,645 B2
(45) Date of Patent: Jan. 5, 2016

(54) APPARATUS AND METHODS FOR FORMING A MEMORY CELL USING CHARGE MONITORING

(71) Applicant: Micron Technology, Inc., Boise, ID (US)

(72) Inventors: Brent Keeth, Boise, ID (US); Durai Vishak Nirmal Ramaswamy, Boise, ID (US); Gurtej S. Sandhu, Boise, ID (US); Adam D. Johnson, Meridian, ID (US); Scott E. Sills, Boise, ID (US); Alessandro Calderoni, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/588,593

(22) Filed: Jan. 2, 2015

(65) Prior Publication Data

US 2015/0124517 A1 May 7, 2015

Related U.S. Application Data

(63) Continuation of application No. 13/772,056, filed on Feb. 20, 2013, now Pat. No. 8,929,125.

(51) Int. Cl.
*G11C 11/00* (2006.01)
*G11C 13/00* (2006.01)
*H01L 21/66* (2006.01)

(52) U.S. Cl.
CPC .......... *G11C 13/0069* (2013.01); *G11C 13/00* (2013.01); *G11C 13/0004* (2013.01);
(Continued)

(58) Field of Classification Search
CPC .............. G11C 13/0021; G11C 13/00; G11C 13/0069; G11C 13/004; G11C 11/5621; G11C 27/005; G11C 27/02
USPC ............ 365/148, 163, 145, 157, 171, 189.07, 365/63
See application file for complete search history.

(56) References Cited

U.S. PATENT DOCUMENTS 5,608,669 A 3/1997 Mi et al.
5,729,495 A 3/1998 Madurawe
(Continued)

FOREIGN PATENT DOCUMENTS

WO WO-2014130543 A1 8/2014

OTHER PUBLICATIONS

"International Application Serial No. PCT/US2014/017147, International Search Report mailed May 26, 2014", 3 pgs.
(Continued)

*Primary Examiner* — Gene Auduong
(74) *Attorney, Agent, or Firm* — Schwegman Lundberg & Woessner, P.A.

(57) ABSTRACT

Apparatus and methods of forming a memory cell are described. In one such method, a forming charge applied to a memory cell, such as a Resistive RAM (RRAM) memory cell, is monitored to determine the progress of the forming the cell. If the cell is consuming charge too slowly, a higher voltage can be applied. If the cell is consuming charge too quickly, a lower voltage can be applied. The charge may be monitored by charging a capacitor to a certain level, then monitoring the discharge rate of the capacitor though the cell. The monitoring may use comparators to measure the charge. The monitoring may also use an analog to digital converter to perform the monitoring.

17 Claims, 5 Drawing Sheets

(52) U.S. Cl.
CPC ........ *G11C13/0021* (2013.01); *G11C 13/0064* (2013.01); *H01L 22/14* (2013.01); *G11C 13/0007* (2013.01); *G11C 2013/0066* (2013.01); *G11C 2013/0071* (2013.01); *G11C 2013/0076* (2013.01); *G11C 2013/0083* (2013.01)

(56) References Cited

U.S. PATENT DOCUMENTS

| | | |
|---|---|---|
| 7,852,669 B2 | 12/2010 | Achter |
| 8,363,443 B2 | 1/2013 | Chevallier et al. |
| 8,559,209 B2 | 10/2013 | Siau |
| 8,929,125 B2 * | 1/2015 | Keeth et al. ................ 365/148 |
| 2003/0117831 A1 | 6/2003 | Hush |
| 2003/0147270 A1 | 8/2003 | Baker |
| 2010/0195393 A1 | 8/2010 | Eggleston |
| 2010/0195415 A1 | 8/2010 | Seko |
| 2010/0290294 A1 | 11/2010 | Siau |
| 2011/0051499 A1 | 3/2011 | Hamilton |
| 2011/0235398 A1 | 9/2011 | Hosono |
| 2012/0096234 A1 | 4/2012 | Jiang et al. |
| 2012/0314477 A1 | 12/2012 | Siau |
| 2014/0233298 A1 | 8/2014 | Keeth et al. |

OTHER PUBLICATIONS

"International Application Serial No. PCT/US2014/017147, Written Opinion mailed May 26, 2014", 5 pgs.

* cited by examiner

APPARATUS AND METHODS FOR FORMING A MEMORY CELL USING CHARGE MONITORING

PRIORITY APPLICATION

This application is a continuation of U.S. application Ser. No. 13/772,056, filed Feb. 20, 2013, which is incorporated herein by reference in its entirety.

BACKGROUND

Apparatus such as computers and other electronic products (e.g., digital televisions, digital cameras, cellular phones, tablets, gaming devices, e-readers, and the like) often have memory devices with memory cells to store information. Some memory devices may include non-volatile cells that store information even when not powered.

DETAILED DESCRIPTION

Common forms of non-volatile memories include flash memory, EPROM (erasable programmable read-only memory), EEPROM (electrically-erasable programmable read-only memory), and the like. A relatively new form of non-volatile memory called resistive random-access memory (RRAM) has been developed that uses new technologies to form the memory cells.

In RRAM, a dielectric is made to conduct through the creation of a filament by applying a relatively high voltage. Materials used to make RRAM include, but are not limited to binary-transition metal-oxide based materials, copper-based materials, and chalcogenides.

In order to form or program an RRAM memory cell, the memory cell is placed in an on state and a certain voltage is applied for a certain amount of time. Prior methods of forming RRAM memory cells used open loop control, applying a fixed voltage for a set amount of time to each memory cell. Typical voltages range from about 3 to about 5 volts to form the memory cell, and about 2 to about 3 volts to program the memory cell, depending on the materials being used, local variations, including thicknesses, resistivity of bit lines/word lines, row and bit line driver differences, and the like. Typical forming times range from 10 to 100 nanoseconds. Again, this value varies, depending on the materials used to form the cells. Forming the RRAM memory cell can be thought of as programming the memory cell for the first time.

However, the above-described technique may not be optimal because it treats every RRAM memory cell the same. In reality, each cell is slightly different.

Some cells require more voltage or charge to form the memory cell. Some cells require less voltage or charge. Using a fixed value for the voltage and time may result in excessive power consumption when more power is used than is needed. Using an excessive amount of power may also detrimentally affect the lifespan of a RRAM memory cell.

Conversely, the same fixed value of voltage and time may not be sufficient to form certain RRAM memory cells. Using an insufficient amount of power may result in a defective RRAM memory cell.

Figure 1:
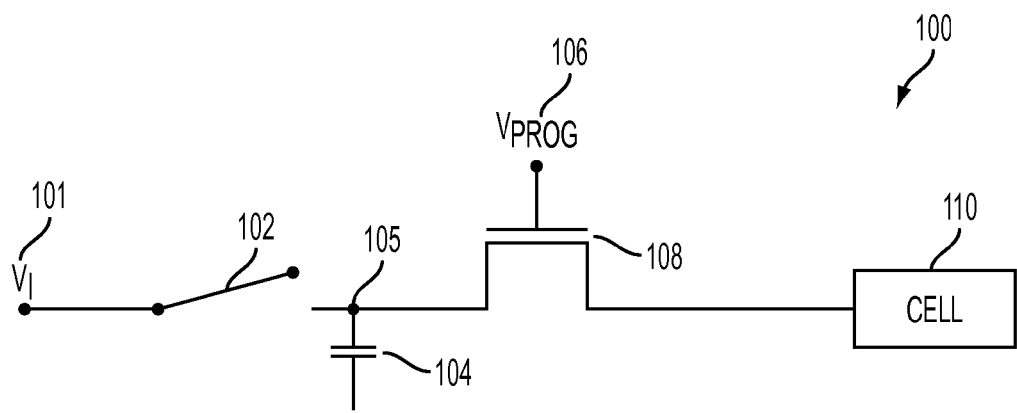
FIG. 1 illustrates a circuit to form a resistive random-access memory cell in one embodiment.

FIG. 1 shows an overview of an embodiment of the invention that uses an adaptive technique to form RRAM memory cells. The total charge used to form a memory cell is monitored. In FIG. 1, memory cell 110 is to be formed. For clarity purposes, other components that may be coupled to the memory cell 110, such as other memory cells, read/write lines, power, and the like, are not illustrated. It should be understood, however, that the typical couplings that a memory cell requires to operate would be present in various embodiments.

A voltage $V_{in}$ 101 is used to charge a capacitor 104 when switch 102 is closed. Capacitor 104 may include either a discrete capacitor or a parasitic capacitor. Transistor 108 is configured in a source follower configuration. Thus, the voltage at memory cell 110 ($V_{cell}$) can be calculated in the following manner:

$$V_{cell} = V_{prog} - V_{gs}$$

where $V_{prog}$ is the voltage at the gate of transistor 108 and $V_{gs}$ is the difference between the voltage at the gate of transistor 108 and the voltage at the source of transistor 108, an intrinsic property of transistor 108.

The use of capacitor 104 enables the charge used to form memory cell 110 to be easily monitored by measuring the voltage of the capacitor $V_{cap}$ (present at node 105). The charge used to form memory 110 cell can be calculated using the following equation:

$$Q_{set} = \Delta V_{cap} * C_{ref}$$

where $C_{ref}$ is the capacitance of capacitor 104, $\Delta V_{cap}$ is the change in voltage at node 105, and $Q_{set}$ is the total charge applied to memory cell 110.

Through appropriate techniques, the process of forming the memory cell 110 can be monitored. Thereafter, the voltage being used to form memory cell 110 can be dynamically adjusted (e.g., changed) to account for the characteristics of memory cell 110. For example, if memory cell 110 is consuming charge too slowly (e.g., the monitored charge is lower than a certain (e.g., predetermined) value after a certain amount of time), thereby forming memory cell 110 too slowly, $V_{prog}$ can be increased so that memory cell 110 consumes charge at a higher rate. Similarly, if memory cell 110 is consuming charge too quickly, which may form memory cell 110 too quickly, $V_{prog}$ can be decreased so that memory cell 110 consumes charge at a lower rate.

Figure 2A:
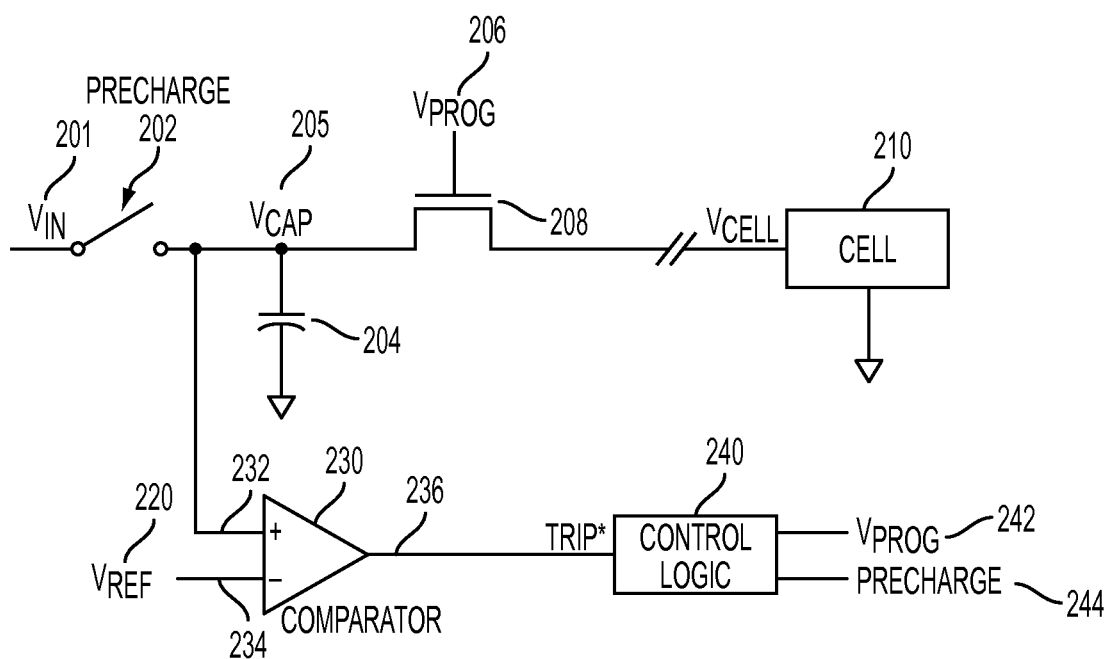
FIG. 2A illustrates a circuit to form a resistive memory cell in another embodiment.

There are several techniques that may be used to monitor and control the charging of the memory cell. An embodiment showing the use of a comparator to monitor the voltage $V_{cap}$ is shown in FIG. 2A. The voltage $V_{in}$ 201, precharge switch 202, voltage $V_{cap}$ 205, capacitor 204, transistor 208, voltage $V_{prog}$ 206, and memory cell 210 serve similar roles to similarly numbered elements shown in FIG. 1.

Coupled to capacitor 204 is a comparator 230. Comparator 230 has two inputs: a positive input 232 and a negative input 234. Coupled to negative input 234 at a reference voltage node is a reference voltage $V_{ref}$ 220. Comparator 230 also has an output 236, which is coupled to control logic 240. Control logic 240 has an output 242 that is coupled to voltage $V_{prog}$ 206, and an output 244 that is coupled to precharge switch 202. In one embodiment, $V_{prog}$ 206 is from 4 to 6 volts, $V_{in}$ 201 is from 5 to 7 volts, and $V_{ref}$ 220 is from 3 to 6 volts.

Capacitor 204 may range in value from approximately 100 femtofarads (fF) to 1 nanofarad (nF).

Comparator 230 is configured so that output 236 is tripped when voltage $V_{cap}$ 205 falls below voltage $V_{ref}$ 220. When the output 236 is tripped, control logic 240 may be configured to lower (which, in some embodiments, can include turning off) voltage $V_{prog}$ 206. In other embodiments, control logic 240 may be configured to raise voltage $V_{prog}$ 206 in certain monitored situations with respect to voltage, charge, or timing.

Figure 2B:
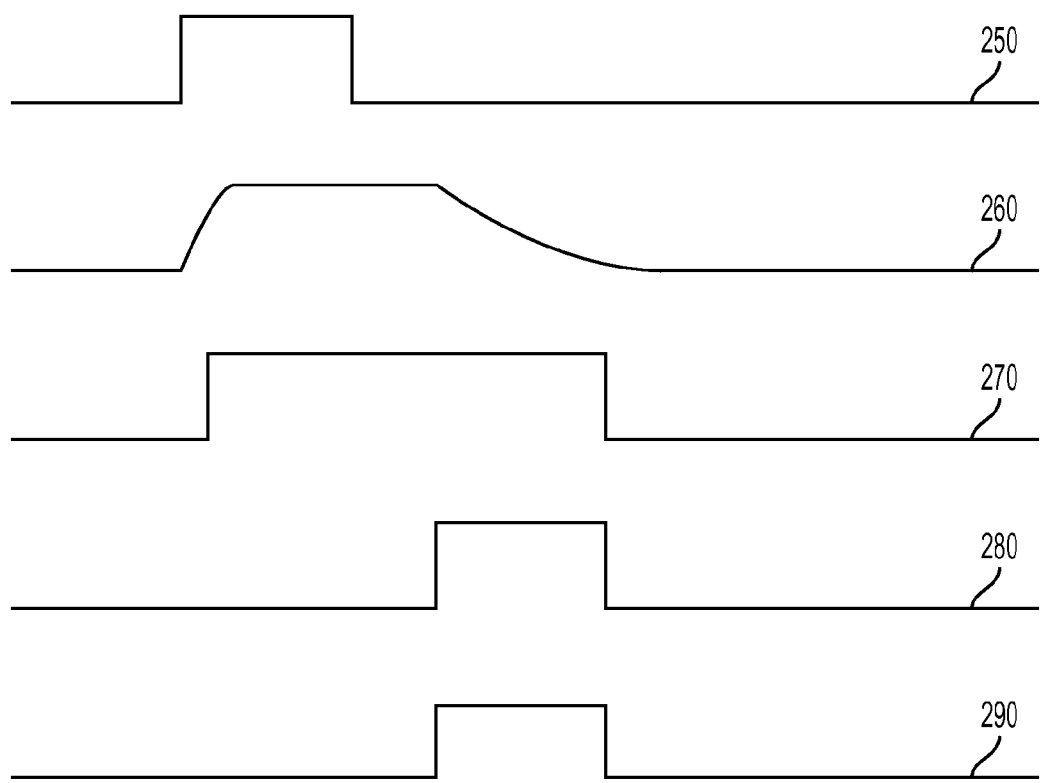
FIG. 2B is a timing diagram illustrating the operation of the circuit embodiment of FIG. 2A.

FIG. 2B is a timing diagram illustrating a possible operation scheme for the circuit embodiment of FIG. 2A. Graph 250 represents the on/off status of precharge switch 202, with the high value being on and the low value being off. Graph 260 represents the voltage at $V_{cap}$ 205. Graph 270 represents the output 236 of comparator 230. Graph 280 represents the voltage at $V_{prog}$ 206, as controlled by control logic 240. Graph 290 represents the voltage at memory cell 210. Each of the graphs 250, 260, 270, 280, 290 are plotted against increasing time.

At the left-hand side of the graphs 250, 260, 270, 280, 290 of FIG. 2B, all the levels are low. When precharge switch 202 is turned on (signified by the amplitude of graph 250 moving to a high level), capacitor 204 begins to charge, illustrated by the increasing voltage $V_{cap}$ 205 shown in graph 260. After a certain amount of time, precharge switch 202 is turned off (signified by the amplitude of graph 250 moving from a high level to a low level). Meanwhile, the output 236 of comparator 230 turns high when the voltage $V_{cap}$ becomes higher than the voltage $V_{ref}$ 220, as illustrated in graph 270. When it is time to start the process of forming the memory cell, voltage $V_{prog}$ is set to a high level, as shown in graph 280. As seen in graph 260, responsive to setting $V_{prog}$ high, capacitor 204 starts to discharge and the voltage $V_{cap}$ begins to decrease. When the voltage $V_{cap}$ becomes lower than the voltage $V_{ref}$, output 236 of comparator 230 goes low, as seen in graph 270. This leads to control logic 240 turning off (e.g, reducing the value of $V_{prog}$ to zero) the voltage $V_{prog}$, as seen in graph 280. This leads the voltage at memory cell 210 to become zero, thus completing the process of forming an RRAM memory cell.

As stated above, by using comparator 230 to monitor the voltage of capacitor 204, the charge flowing into memory cell 210 can be monitored. In the embodiment shown in FIGS. 2A and 2B, comparator 230, in essence, is monitoring the process of forming the memory cell 210. If memory cell 210 is forming more quickly than desired, capacitor 204 will discharge quickly, leading to $V_{prog}$ being turned off quickly. If memory cell 210 is being formed more slowly than desired, capacitor 204 will discharge more slowly, leading to $V_{prog}$ being turned off later, so that memory cell 210 is subjected to a charge for a longer period of time.

Figure 3:
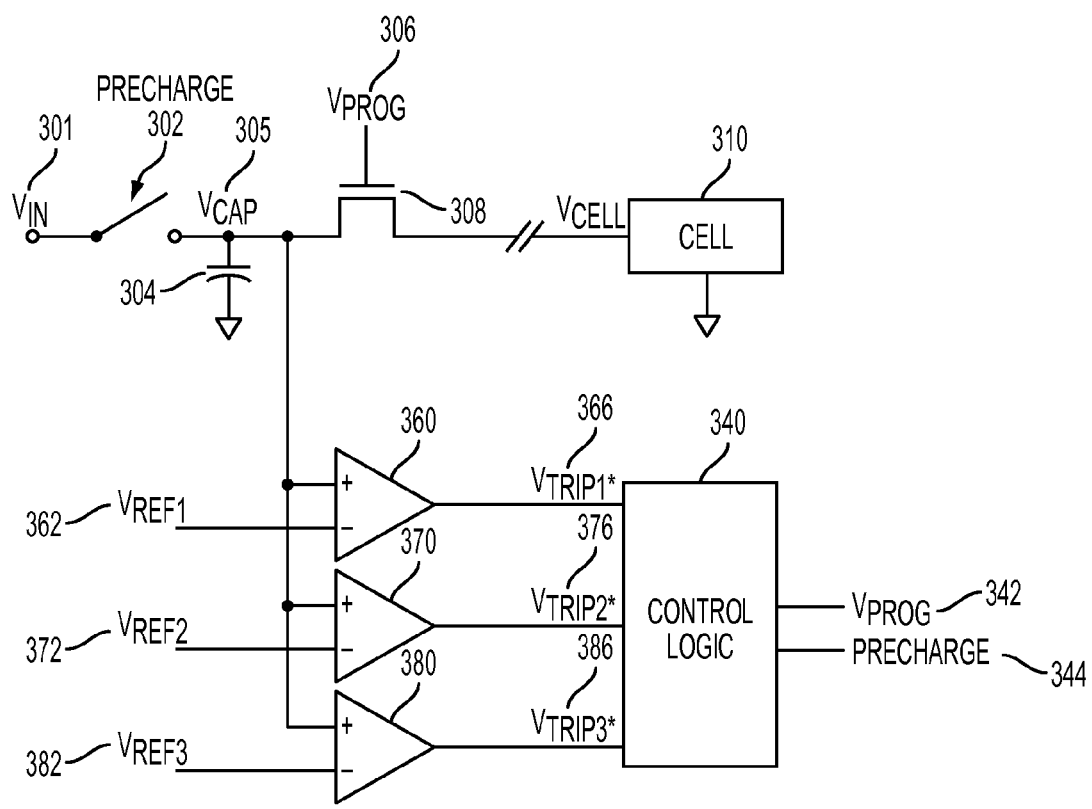
FIG. 3 illustrates a circuit utilizing multiple comparators to program a memory cell.

Another embodiment of a programming circuit is shown in FIG. 3. Voltage $V_{in}$ 301, precharge switch 302, Voltage $V_{cap}$ 305, capacitor 304, transistor 308, Voltage $V_{prog}$ 306, and memory cell 310 serve roles that are similar to similarly numbered elements shown in FIGS. 1 and 2A.

Here, capacitor 304 is coupled to the positive input of three comparators 360, 370, and 380. The negative input of each of the three comparators 360, 370, 380 is coupled to a different reference voltage $V_{ref1}$ 362, $V_{ref2}$ 372, and $V_{ref3}$ 382, respectively. Thus, voltage $V_{ref1}$ 362 is coupled to the negative input of comparator 360; voltage $V_{ref2}$ 372 is coupled to the negative input of comparator 370; and voltage $V_{ref3}$ 382 is coupled to the negative input of comparator 380.

Each of the comparators 360, 370, and 380 has an output. Comparator 360 has an output 366 (labeled $V_{trip1}$). Comparator 370 has an output 376 (labeled $V_{trip2}$). Comparator 380 has an output 386 (labeled $V_{trip3}$). The outputs of each of comparators 360, 370, and 380 are coupled to control logic 340. Control logic 340 has two outputs 342 and 344. Output 342 is coupled to $V_{prog}$ 306 and output 344 is coupled to precharge switch 302.

The use of three comparators allows fine adjustment of the voltage $V_{prog}$. In one embodiment, $V_{ref1}$ is greater than $V_{ref2}$, which is greater than $V_{ref3}$. In one embodiment, $V_{ref1}=V_{in}-0.5$ V, $V_{ref2}=V_{in}-1$ V, and $V_{ref3}=V_{in}-1.5$ V. Other voltages may be used in other embodiments. Such a configuration causes comparator 360 to become activated first, causing the output 366 to change first, followed later in time by output 376 and output 386. Several different uses can be made out of this activity.

In one embodiment, the level of $V_{prog}$, instead of merely having two levels as described with respect to FIG. 2A (substantially equivalent to on and off, or logic '0' and logic '1'), may have 3 levels—one that is triggered with each different comparator changing value. For example, the voltage $V_{prog}$ may be set to a first level to begin the forming of memory cell 310. After comparator 360 changes value (signifying that the voltage $V_{cap}$ 305 has fallen to a first level), the voltage $V_{prog}$ is set to a second value to control the formation speed of memory cell 310. This second value may be higher or lower than the first value. After comparator 370 changes value (signifying that the voltage $V_{cap}$ 305 has fallen to a second level), the voltage $V_{prog}$ is set to a third value. Again, this third value may be any value, higher or lower than either the first or the second value.

After comparator 380 changes value (signifying the voltage $V_{cap}$ 305 has fallen to a third level), the voltage $V_{prog}$ may be set to a value that turns off transistor 308, ceasing the activity of forming memory cell 310.

In one embodiment, the third value for the voltage $V_{prog}$ is greater than the second value for the voltage $V_{prog}$ which, in turn, is higher than the first value of the voltage $V_{prog}$. It should be understood, however, that a variety of materials used to create memory cell 310 may result in different values for the voltage $V_{prog}$ 310 being used in other embodiments. It should also be understood that while the use of three comparators is shown in FIG. 3, this embodiment can be extended to other numbers of comparators, both less than three or greater than three, depending on the resolution desired.

Figure 4:
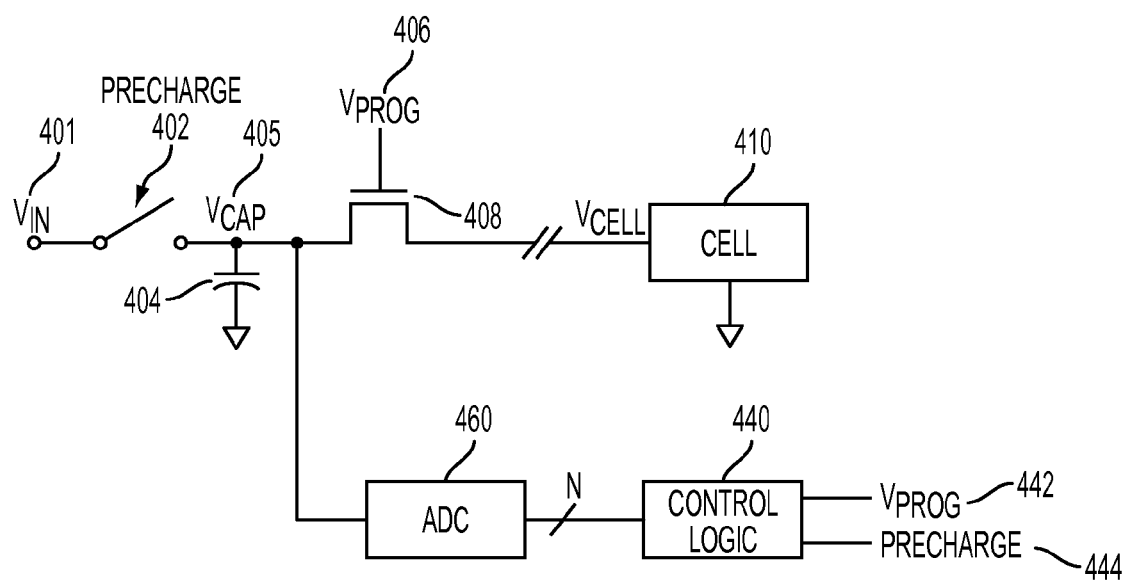
FIG. 4 is an illustration of another forming apparatus embodiment using an analog to digital converter.

Another embodiment of an apparatus for forming memory cells is shown in FIG. 4. Voltage $V_{in}$ 401, precharge switch 402, voltage $V_{cap}$ 405, capacitor 404, transistor 408, voltage $V_{prog}$ 406, and memory cell 410 serve similar roles to similarly numbered elements shown in FIGS. 1, 2A, and 3. Coupled to capacitor 404 is an analog to digital converter (ADC) 460. ADC 460 is coupled to control logic 440, which is in turn coupled to precharge switch 402 and the voltage $V_{prog}$ 406.

The use of ADC 460 allows precise adjustments to be made to the operation of control logic 440. In particular, ADC 460 will generally have a finer resolution than a multiple comparator scheme, such as the one illustrated in FIG. 3. Control logic 440 is thus configured to adjust the voltage $V_{prog}$ 406 and precharge switch 402 operation based on the values provided by ADC 460. As explained with respect to FIG. 3, there are many possible ways to vary the value of the voltage $V_{prog}$ 406; in this case, based on the output of ADC 460.

For example, the voltage $V_{prog}$ 406 may be continually rising as ADC 460 senses a lowering of the voltage $V_{cap}$ 405. Or the voltage $V_{prog}$ 406 may be continually falling as ADC 460 senses a lowering of the voltage $V_{cap}$ 405. Or the voltage $V_{prog}$ 406 may vary both upwards and downwards as ADC 460 senses a lowering of $V_{cap}$ 405.

In addition, the variable of time may be used by control logic 440. For example, if the control logic 440, through the use of a timer internal to control logic 440, senses that the forming of memory cell 410 is taking longer than desired (e.g., by sensing that the voltage Vcap 405 is higher than it should be at a certain time), it can raise the voltage $V_{prog}$ 406 to a voltage higher than it otherwise might be. If the control logic 440 senses that the programming of memory cell 410 is taking less time than is desired, it can lower the voltage $V_{prog}$ 406 to a value that is less than it otherwise might be.

These illustrations of apparatus are intended to provide a general understanding of the structure of various embodiments and are not intended to provide a complete description of all the elements and features of apparatus that might make use of the structures described herein.

Any of the components described above can be implemented in a number of ways, including simulation via software. Thus, the apparatus described above may all be characterized as "modules" (or "module") herein. Such modules may include or be included in hardware circuitry, single and/or multi-processor circuits, memory circuits, software program modules and objects and/or firmware, and combinations thereof, as desired by the architect of the apparatus and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus may further be included as subcomponents within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others The embodiments described above with reference to FIG. 1 through FIG. 4 include a method for forming a memory cell that comprises: applying a voltage to a memory cell; monitoring a forming charge applied to the memory cell via the voltage; and adjusting the voltage based on the charge being monitored.

Applying a voltage to a memory cell may comprise charging a capacitor having a capacitance and discharging the capacitor through the memory cell. Monitoring a forming charge may comprise measuring a change in voltage across the capacitor. Adjusting the voltage may comprise raising the voltage when the monitored charge is lower than a certain value. Adjusting the first voltage may comprise lowering the voltage when the monitored charge is higher than a certain predetermined value.

An apparatus may comprise a memory cell; a capacitor; a comparator with a first input coupled to the capacitor, a second input coupled to a reference voltage node and an output; a transistor coupled to the capacitor and to the memory cell; and control logic coupled to the output of the comparator. The control logic may be configured to adjust a voltage applied to a gate of the transistor based on the output of the comparator to form the memory cell.

The control logic may be configured to adjust the voltage applied to the gate of the transistor responsive to a voltage at the first input of the first comparator becoming lower than a voltage at the second input of the first comparator.

The comparator may comprise a first comparator and the reference voltage node may comprise a first reference voltage node. There may be a second comparator with a first input coupled to the capacitor, a second input coupled to a second reference voltage node, and an output. The output of the second comparator is coupled to the control logic. During operation a voltage at the second reference voltage node is lower than a voltage at the first reference voltage node.

The control logic may be configured to adjust the voltage applied to the gate of the transistor to a first level responsive to the voltage at the first input of the first comparator becoming lower than the voltage at the second input of the first comparator. The control logic may be further configured to adjust the voltage applied to the gate of the transistor to a second level responsive to a voltage at the first input of the second comparator becoming lower than a voltage at the second input of the second comparator.

In some embodiments, the memory cell may comprise a resistive random access memory (RRAM) cell.

In some embodiments, the capacitor has a capacitance in the range of 100 femtofarads to 1 nanofarad.

In some embodiments, the transistor may be configured in a source follower configuration.

In some embodiments, there may be a switch coupled to the capacitor; wherein the switch is further coupled to the control logic. The control logic may be configured to operate the switch to begin and end a charging of the capacitor.

In some embodiments, an apparatus may comprise a memory cell; a capacitor; a transistor coupled to the memory cell and to the capacitor; an analog to digital converter (ADC) coupled to the capacitor, the ADC having an output based on a voltage of the capacitor; and control logic coupled to the output of the ADC. The control logic may be configured to adjust a voltage applied to a gate of the transistor based on the output of the ADC to form the memory cell.

The control logic may be configured to adjust the voltage applied to the gate of the transistor responsive to the output of the ADC indicating that the voltage of the capacitor has reached a first level.

In some embodiments, the control logic is configured to adjust the voltage comprises the control logic being configured to lower the voltage applied to the gate of the transistor.

In some embodiments, the control logic is configured to adjust the voltage applied to the gate of the transistor responsive to the output of the ADC indicating that the voltage of the capacitor has reached a second level.

In some embodiments, the memory cell comprises a resistive random access memory (RRAM) cell.

In some embodiments, the transistor may be configured in a source follower configuration. In some embodiments, there may be a switch coupled to the capacitor. The switch may be further coupled to the control logic. The control logic may be configured to operate the switch to begin and end a charging of the capacitor.

In some embodiments, a method of forming a memory cell may comprise charging a capacitor; coupling the charged capacitor to the memory cell; monitoring a forming charge applied to the memory cell responsive to coupling the charged capacitor to the memory cell; and decoupling the charged capacitor from the memory cell responsive to the monitoring.

In some embodiments, the method may include controlling the charging of the capacitor based on the monitored charge.

In some embodiments, a method for forming a memory cell may comprise charging a capacitor; discharging the capacitor through a transistor coupled to a memory cell; monitoring the charge that was discharged to the memory cell; and determining if the charge is sufficient to form the memory cell.

In some embodiments, charging a capacitor may comprise coupling the capacitor to a voltage source for a certain amount of time; and de-coupling the capacitor from the voltage source after the certain amount of time.

In some embodiments, the method further includes de-coupling the memory cell from the capacitor responsive to determining that the charge is sufficient to form the memory cell.

In summary, when various embodiments of the invention are implemented, the operation of memory devices having RRAM cells may become more efficient and have a longer lifespan. As a result, consumer satisfaction may be increased.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method comprising:
applying a voltage to a resistive memory cell during intitial programming of the resistive memory cell;
monitoring consumption of charge as a function of time during the initial programming of the resistive memory cell; and
adjusting the voltage based on the monitored consumption of charge.

2. The method of claim 1, wherein monitoring includes comparing charge to a predetermined value of charge after a predetermined amount of time based on a change of voltage of a capacitor coupled to the resistive memory cell.

3. The method of claim 2, wherein the method includes using a comparator or an analog to digital converter to monitor the change of voltage of the capacitor.

4. The method of claim 1, wherein applying the voltage to the resistive memory cell during the initial programming includes applying the voltage with more than two levels, one of the levels to control speed of the initial programming.

5. The method of claim 4, wherein the value of the more than two levels is based on the materials of the memory cell.

6. The method of claim 1, wherein the monitoring includes sensing whether time of the initial programming is taking longer or less time based on an internal timer of control logic.

7. The method of claim 6, wherein applying the voltage includes generating a precharge signal from the control logic to control a precharge switch.

8. An apparatus comprising:
a resistive memory cell;
a capacitor;
a transistor coupled between the capacitor and the resistive memory cell;
control logic to apply and adjust a gate voltage to the transistor to control application of a voltage to the resistive memory cell during initial programming of the resistive memory cell based on a monitoring of consumption of charge as a function of time during the initial programming of the resistive memory cell.

9. The apparatus of claim 8, wherein the apparatus includes a comparator having an input coupled to the capacitor and an input to receive a reference voltage and having an output coupled to the control logic to provide a signal based on comparison of voltage at the capacitor with the reference voltage to monitor the consumption of charge.

10. The apparatus of claim 9, wherein the control logic is structured adjust the gate voltage to turn off the transistor based on a trigger signal from comparison of voltage at the capacitor with the reference voltage.

11. The apparatus of claim 8, wherein the apparatus includes a plurality of comparators, each comparator having an input coupled to the capacitor and an input to receive a reference voltage assigned to the respective comparator and having an output coupled to the control logic to provide a signal based on comparison of voltage at the capacitor with the respective reference voltage to monitor the consumption of charge.

12. The apparatus of claim 11, wherein the control logic is structured to control speed of the initial programming based on input signals from the plurality of comparators.

13. The apparatus of claim 8, wherein the apparatus includes a switch controlled by the control logic to apply a voltage to the capacitor.

14. The apparatus of claim 8, wherein the apparatus includes an analog to digital converter coupled between the capacitor and the control logic, the control logic configured to adjust the gate voltage based on values provided by the analog to digital converter.

15. The apparatus of claim 14, wherein the apparatus includes a switch coupled to the capacitor, the control logic configured to control the switch based on values provided by the analog to digital converter.

16. The apparatus of claim 8, wherein the control logic includes an internal timer to sense whether time of the initial programming is taking longer or less time than a specified time.

17. The apparatus of claim 8, wherein the resistive memory cell is structured from material selected from a group of materials including binary-transition metal-oxide based materials, copper-based materials, and chalcogenides.

* * * * *